US 9,711,493 B2

(12) United States Patent
Lin

(10) Patent No.: US 9,711,493 B2
(45) Date of Patent: Jul. 18, 2017

(54) INTEGRATED OPTICAL SENSOR AND METHODS FOR MANUFACTURING AND USING THE SAME

(71) Applicant: Shanghai Oxi Technology Co., Ltd., Shanghai (CN)

(72) Inventor: Weiping Lin, Shanghai (CN)

(73) Assignee: SHANGHAI OXI TECHNOLOGY CO., LTD., Shanghai (CN)

( * ) Notice: Subject to any disclaimer, the term of this patent is extended or adjusted under 35 U.S.C. 154(b) by 331 days.

(21) Appl. No.: 14/493,932

(22) Filed: Sep. 23, 2014

(65) Prior Publication Data
US 2015/0371074 A1 Dec. 24, 2015

(30) Foreign Application Priority Data

Jun. 23, 2014 (CN) .......................... 2014 1 0284269

(51) Int. Cl.
G03B 29/00 (2006.01)
H01L 25/16 (2006.01)
H01L 27/146 (2006.01)
G06K 9/00 (2006.01)

(52) U.S. Cl.
CPC .......... *H01L 25/167* (2013.01); *G06K 9/0004* (2013.01); *H01L 27/14679* (2013.01); *H01L 2924/0002* (2013.01)

(58) Field of Classification Search
USPC .......................................................... 396/15
See application file for complete search history.

(56) References Cited

U.S. PATENT DOCUMENTS

| 2010/0321341 | A1 | 12/2010 | Cho et al. | |
| 2012/0321149 | A1* | 12/2012 | Carver | G06K 9/0004 382/124 |
| 2013/0112855 | A1* | 5/2013 | McLeod | G01J 3/513 250/208.2 |
| 2013/0119237 | A1* | 5/2013 | Raguin | H01L 27/14601 250/208.1 |

(Continued)

FOREIGN PATENT DOCUMENTS

TW 2011-00904 A 1/2011

OTHER PUBLICATIONS

Chinese Patent Application No. 201410284269.7; First Office Action dated Mar. 30, 2017; English Translation 16 pages.

*Primary Examiner* — Rodney Fuller
(74) *Attorney, Agent, or Firm* — Swanson & Bratschun, L.L.C.

(57) ABSTRACT

An integrated optical sensor and methods for forming and using the same is provided. The integrated optical sensor comprising: a light source; a transparent substrate, having a first surface and a second surface opposite to each other; a first pixel cell array region, located on the first surface and adapted to receiving lights emitted from the light source and reflected by an external object; a second pixel cell array region, located on the first surface and adapted to receiving lights emitted from the light source and reflected by the fingerprint; and a third pixel cell array region, located on the first surface and adapted to receiving visible lights from outside. The integrated optical sensor has simplified structures, the forming method thereof has improved processes, and the using method thereof has more applications. Besides, production costs may be reduced.

34 Claims, 5 Drawing Sheets

(56) References Cited

U.S. PATENT DOCUMENTS

| | | | | |
|---|---|---|---|---|
| 2013/0120760 A1* | 5/2013 | Raguin | ............... | G01B 11/24 356/612 |
| 2015/0369661 A1* | 12/2015 | Lin | ............... | G06K 9/0004 250/227.11 |
| 2016/0132712 A1* | 5/2016 | Yang | ............... | G06K 9/0002 348/77 |

* cited by examiner

INTEGRATED OPTICAL SENSOR AND METHODS FOR MANUFACTURING AND USING THE SAME

CROSS-REFERENCE TO RELATED APPLICATIONS

The present application claims priority to Chinese patent application No. 201410284269.7, filed on Jun. 23, 2014, and entitled "INTEGRATED OPTICAL SENSOR AND METHODS FOR MANUFACTURING AND USING THE SAME", the entire disclosure of which is incorporated herein by reference.

TECHNICAL FIELD

The present disclosure generally relates to optical sensor, and more particularly, to an integrated optical sensor, a method for forming an integrated optical sensor and a method for using an integrated optical sensor.

BACKGROUND

Nowadays, more and more sensors are applied in consumer electronic devices, such as mobile phones, tablet personal computers, and the like, for enhancing perceptions to various environmental parameters. For example, fingerprint sensors, ambient light sensors and proximity sensors are already widely used.

FIG. 1 schematically illustrates function of a conventional ambient light sensor. Normally, visible lights 101 in the outside surroundings may enter into the ambient light sensor, and be detected by a photosensitive device 102 (e.g. photosensitive diode) inside the ambient light sensor. The photosensitive device 102 can generate electric current which is proportional to the intensity of the received visible lights 101. Thereafter, the photon currents are detected and digitalized by a semiconductor chip (not shown in FIG. 1). The light currents generated by the photosensitive device 102 are proportional to the intensity of the received light, thus the light intensity can be represented by digital signals which are generated by the semiconductor chip based on the photon currents. As such, environment light 101 can be measured.

FIG. 2 schematically illustrates function of a conventional proximity sensor. Specifically, incident lights 202, generally infrared lights, are emitted from a light source 201 of the proximity sensor. Then the incident light 202 reach an object 203 and be reflected there, generating reflected lights 204. The reflected lights 204 are received by a detector 205, normally a photodiode, in the proximity sensor. As intensity of the reflected lights 204 received by the detector 205 is proportional to a distance between the detector 205 and the object 203, through detecting the light intensity of the reflected lights 204, the distance between the object 203 and the proximity sensor can be obtained.

Currently, there are generally two dominant fingerprint sensors, one is optical fingerprint sensor and the other is semiconductor capacitance fingerprint sensor. The optical fingerprint sensor generally includes focusing optical fingerprint sensor and non-focusing optical fingerprint sensor. The focusing fingerprint sensor implements fingerprint sensing by focusing fingerprint image light beams on the small-dimension optical sensor through light refractions and light reflections. However, the focusing optical fingerprint sensors generally have a larger thickness, which is one of the main drawbacks of the conventional focusing optical fingerprint sensors. Specifically, in order to focus light beams of fingerprint images, a finger with fingerprints should be put on an optical lens and irradiated by a built-in light source which is disposed on a bottom of the optical sensor. Lights emitted from the light source reach a triangular prism on which refractions of the lights occur and refracted lights will be generated. Then the refracted lights reach a surface of the finger on which reflections occur. Angles and intensity of reflected lights from ridge and valley of the fingerprint are different. As such, a spatial distribution image of the light intensity can be obtained. Thereafter, the image is focused on a charge-coupled device (e.g. CMOS pixel cell array or CCD pixel cell array) through devices such as triangular prisms, optical lens, and the like, so that a multi-gray fingerprint image can be obtained. Accordingly, triangular prisms and optical lens are required to implement the focus optical fingerprint sensor, thus the focus optical fingerprint sensor may has a long optical path and large in total thickness.

The non-focusing optical fingerprint sensor is implemented through ways as followed: lights emitted from a light source in the non-focusing optical fingerprint sensor reach a finger which is contacted with the sensor, generating reflected lights. The reflected lights then enter into the non-focusing optical fingerprint sensor for generating a fingerprint image according to light intensity and spatial distribution of the reflected lights. As light intensity and spatial distribution of the reflected lights may vary according to different shapes of the fingerprint, a valid fingerprint image can be obtained. Further, the fingerprint image obtained may have a size equal to that of the fingerprint.

Currently, fingerprint sensors, ambient light sensors and proximity sensors are generally integrated into electronic devices independently, which has following drawbacks.

From structure aspect, as multiple independent sensors can not share their components such as power sources, communication interfaces, light sources, and the like, with each other, multiple components are required to support these sensors. As such, devices with multiple independent sensors have complex structures, and cost is increased. Besides, as multiple independent sensors certainly take more interior spaces of electronic devices, the electronic devices may not be easily miniaturized and may be not portable as well when multiple independent sensors applied.

From manufacturing aspect, as multiple sensors are manufactured independently, the manufacturing process may have numerous complicated steps. Besides, these multiple sensors may be required to be packaged separately. As such, process difficulties may be increased and yield may be reduced. Furthermore, complicated manufacturing and packing processes can cause longer processing time, lower production efficiency and higher cost.

From application aspect, as multiple sensors are independent from each other, information collected by each sensor has no correlation and can not be shared. As such, each sensor has a single function and has no interaction with other sensors. Therefore, the multiple independent sensors may have lower application value.

SUMMARY

Embodiments of the present disclosure provide integrated optical sensors with simplified structures, forming methods thereof with improved processes and using methods thereof with more applications. Besides, production costs may be reduced.

According to one embodiment, an integrated optical sensor is provided, including:

a light source; a transparent substrate, having a first surface and a second surface opposite to each other; a first pixel cell array region, located on the first surface and adapted to receiving lights emitted from the light source and reflected by an external object; a second pixel cell array region, located on the first surface and adapted to receiving lights emitted from the light source and reflected by a fingerprint; and a third pixel cell array region, located on the first surface and adapted to receiving visible lights from outside.

Optionally, the integrated optical sensor further includes: an encapsulation substrate which is located on and covering the first pixel cell array region, the second pixel cell array region and third pixel cell array region.

Optionally, the integrated optical sensor further includes: a cover plate above the transparent substrate and facing the first surface.

Optionally, the light source is below the transparent substrate and facing the second surface.

Optionally, the first pixel cell array region includes an array of first pixel cells each of which includes a first transparent region, a first light barrier region and a first photodiode located on the first light barrier region; the second pixel cell array region includes an array of second pixel cells each of which includes a second transparent region, a second light barrier region and a second photodiode located on the second light barrier region; and the third pixel cell array region includes an array of third pixel cells each of which includes a third light barrier region and a third photodiode located on the third light barrier region.

Optionally, the first light barrier region has a first barrier layer located on the transparent substrate; the second light barrier region has a second barrier layer located on the transparent substrate; the third light barrier region has a third barrier layer located on the transparent substrate.

Optionally, each of the first pixel cells, the second pixel cells and the third pixel cells includes one or more thin film transistors which are amorphous silicon thin film transistors.

Optionally, the second pixel cells are coupled to a control chip through a gate driving circuit.

Optionally, the gate driving circuit is located on the transparent substrate or an external circuit chip.

Optionally, the first pixel cells, the second pixel cells and the third pixel cells are coupled to a system chip through a data reading circuit.

Optionally, the light source includes at least one selected from an infrared light source and a visible light source.

Optionally, the second pixel cell array region is disposed between the first pixel cell array region and the third pixel cell array region.

According to an embodiment of the present disclosure, a method for using the integrated sensor as recited above is provided, including:

using the third pixel cell array region to receive visible lights transmitted from an outside of the cover plate for obtaining ambient light information; using the second pixel cell array region to receive lights emitted from the light source and reflected by a fingerprint which is contacted with the cover plate, so as to obtain fingerprint image information; and implementing a background interference elimination to fingerprint image information based on the ambient light information obtained.

Optionally, the method further includes:
using the first pixel cell array region to receive lights which are emitted from the light source and reflected by a finger adjacent to the cover plate for obtaining distance information of the finger; and determining whether the finger is contacted with the cover plate according to the distance information obtained.

According to an embodiment of the present disclosure, a method for manufacturing the integrated sensor as recited above is provided, including:

providing a transparent substrate and a light source, wherein the transparent substrate has a first surface and a second surface opposite to each other; forming a first pixel cell array region on the first surface, wherein the first pixel cell array region is adapted to receiving lights emitted from the light source and reflected by an external object; forming a second pixel cell array region on the first surface, wherein the second pixel cell array region is adapted to receiving lights emitted from the light source and reflected by a fingerprint; and forming a third pixel cell array region on the first surface, wherein the third pixel cell array region is adapted to receiving visible lights from outside.

Optionally, the manufacturing method further includes: forming an encapsulation substrate on the first pixel cell array region, the second pixel cell array region and third pixel cell array region, wherein the encapsulation substrate covers the first pixel cell array region, the second pixel cell array region and third pixel cell array region.

Optionally, the manufacturing method further includes: providing a cover plate; and after the first pixel cell array region, the second pixel cell array region and the third pixel cell array region are formed, disposing the cover plate at a position above the transparent substrate and facing the first surface.

Optionally, the manufacturing method further includes after the first pixel cell array region, the second pixel cell array region and the third pixel cell array region are formed, disposing the light source at a position which below the transparent substrate and facing the second surface.

Optionally, after the first pixel cell array region, the second pixel cell array region and the third pixel cell array region are formed, the manufacturing method further includes:

forming an array of first pixel cells on the first surface, each of the first pixel cell includes a first transparent region, a first light barrier region and a first photodiode located on the first light barrier region; forming an array of second pixel cells on the first surface, each of the second pixel cells includes a second transparent region, a second light barrier region and a second photodiode located on the second light barrier region; and forming an array of third pixel cells on the first surface, each of the third pixel cells includes a third light barrier region and a third photodiode located on the third light barrier region.

Optionally, the first light barrier region is formed by forming a first barrier layer on the transparent substrate; the second light barrier region is formed by forming a second barrier layer on the transparent substrate; and the third light barrier region is formed by forming a third barrier layer on the transparent substrate.

Optionally, each of the first pixel cells, the second pixel cells and the third pixel cells includes one or more thin film transistors which are amorphous silicon thin film transistors.

Optionally, forming a gate driving circuit when forming the first pixel cells, for coupling the second pixel cells with a control chip.

Optionally, disposing the gate driving circuit on the transparent substrate or an external circuit chip.

Optionally, forming a data reading circuit when forming the first pixel cells, the second pixel cells and the third pixel cells, for coupling charge signals of the first pixel cells, the second pixel cells and the third pixel cells with a system chip.

Optionally, the light source includes at least one selected from an infrared light source and visible light source.

Optionally, the second pixel cell array region is formed between the first pixel cell array region and the third pixel cell array region.

Accordingly, in embodiments provided by the present disclosure, the first pixel cell array region, the second pixel cell array region and the third pixel cell region are fabricated together, which has the following advantages in comparison to prior art.

Firstly, the above recited three pixel cell regions function as a proximity sensor, a fingerprint sensor and an ambient light sensor, respectively. An integrated optical sensor of the present disclosure only requires one single unified power source, communication interface, chip, light source, and the like, thus the integrated optical sensor may have simple and compact structure, and low cost. Furthermore, the integrated optical sensor may have a preferable structural arrangement, thus less space is required to dispose. Therefore, mini, thin and light electronic devices may be easily achieved when the integrated optical sensors are applied therein.

Secondly, the first pixel cell array region, the second pixel cell array region and the third pixel cell region which have different functions are able to work coordinately. Therefore, these functions can be orderly and coordinately implemented through one same system controller, almost without any mutual interference. Furthermore, information collected by each pixel cell array region is correlated and can be shared with each other. Accordingly, more operations and works can be implemented, thus the integrated optical sensor may have more application value.

Thirdly, as the first pixel cell array region, the second pixel cell array region and the third pixel cell region are fabricated simultaneously, fewer processing steps may be required, and an easier encapsulation process may be further implemented. Furthermore, the three pixel cell array regions are formed in different regions, so there may be no interference from each other. Therefore, the process of manufacturing the integrated optical sensor can have more simple manufacturing process, higher yield, less processing time, and lower production cost.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

The present disclosure provides an integrated optical sensor and methods for manufacturing and using the same. The integrated optical sensor includes a light source and a transparent substrate, wherein the transparent substrate has a first surface and a second surface opposite to each other. The integrated optical sensor further includes a first pixel cell array region, a second pixel cell array region and a third pixel cell array region which are all located on the first surface, wherein the first pixel cell array region is adapted to receiving lights emitted from the light source and reflected by an external object adjacent to a cover plate of the sensor; the second pixel cell array region is adapted to receiving lights emitted from the light source and reflected by a fingerprint contacted with the cover plate; and the third pixel cell array region is adapted to receiving visible lights from an outside of the cover plate. The first pixel cell array region, the second pixel cell array region and the third pixel cell array region function as a proximity sensor, a fingerprint sensor and an ambient light sensor, respectively. Furthermore, the integrated optical sensor of the present disclosure only requires one single unified power source, communication interface, chip, light source, and the like, and can be fabricated in one single unified manufacturing process. Therefore, the integrated optical sensor may have simple and compact structure, and low cost. Besides, the integrated optical sensor may have a preferable structural arrangement, thus less space is required to be disposed. Therefore, mini, thin and light electronic devices may be easily achieved when the integrated optical sensors are applied therein.

Referring to FIG. 3 to FIG. 6, an integrated optical sensor according to one embodiment of the present disclosure is illustrated.

Figure 1:
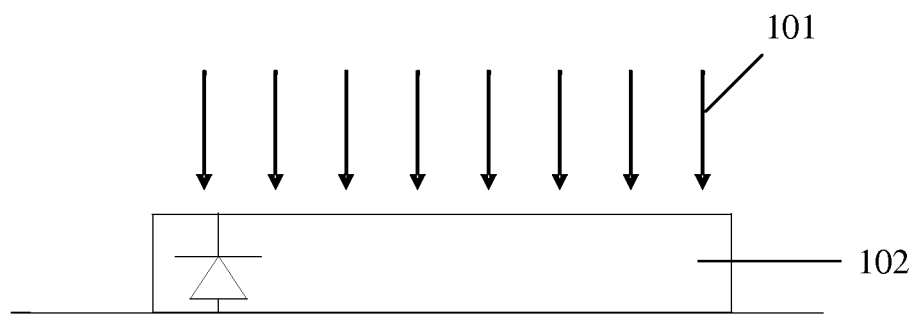
FIG. 1 schematically illustrates a conventional ambient light sensor.
Figure 2:
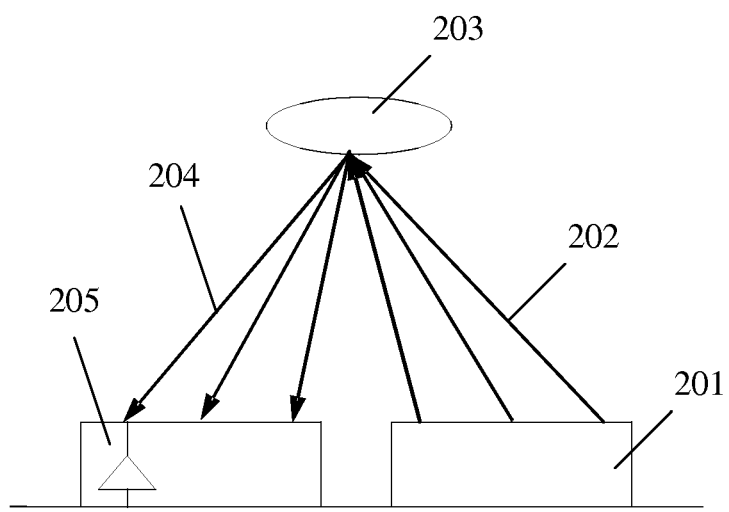
FIG. 2 schematically illustrates a conventional proximity sensor.
Figure 3:
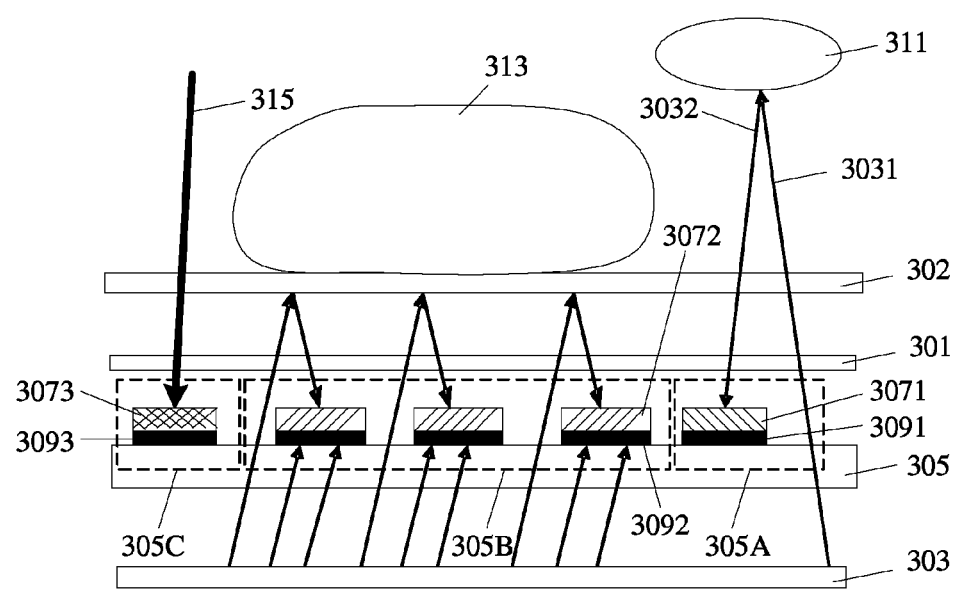
FIG. 3 schematically illustrates an integrated optical sensor according to an embodiment of the present disclosure.

As shown in FIG. 3, the integrated optical sensor of the present disclosure includes a light source 303 and a transparent substrate 305 which has a first surface (not labeled) and a second surface (not labeled).

The transparent substrate 305 has a first pixel cell array region 305A, a second pixel cell array region 305B, and a third pixel cell array region 305C which are located on the first surface. Dotted boxes are regions where the three pixel cell array regions located.

The first pixel cell array region 305A is adapted to receiving lights emitted from the light source 303 and reflected by an object 311 adjacent to a cover plate 302; the second pixel cell array region 305B is adapted to receiving lights emitted from the light source 303 and reflected by a fingerprint of a finger 313 which is contacted with the cover plate 302; the third pixel cell array region 305C is adapted to receiving the visible lights 315 transmitted from an outside of the cover plate 302.

In some embodiments, the integrated optical sensor further includes a encapsulation substrate 301, wherein the encapsulation substrate 301 is located on and covers the first pixel cell array region 305A, the second pixel cell array region 305B, and the third pixel cell array region 305C. In fact, the first pixel cell array region 305A, the second pixel cell array region 305B, and the third pixel cell array region 305C may be formed in an integral processing, and the encapsulation substrate 301 may be formed in this integral processing as well. Therefore, the transparent substrate 305, the first pixel cell array region 305A, the second pixel cell array region 305B, the third pixel cell array region 305C and the encapsulation substrate 301 constitute an integral structure.

In some embodiments, the cover plate 302 in the integrated optical sensor has transparency. Thus, the cover plate 302 may be made of glass, resin, or any other suitable materials.

In some embodiments, the cover plate 302 may has an outer side (not labeled) and an inner side (not labeled), the outer side of the cover plate is also the exterior of the integrated optical sensor, and the inner side of the cover plate 302 is also the interior of the integrated optical sensor.

In some embodiments, the thin film transistors in each the pixel cell array are amorphous silicon thin film transistors, on this condition, the transparent substrate may be a glass substrate. Of course, the transparent substrate 305 may be made of different materials under different circumstances. For example, the transparent substrate 305 may be made of plastic.

It should to be noted that, in some other embodiments, the integrated optical sensor may includes no cover plate 302.

In some embodiments, the transparent substrate is disposed between the cover plate 302 and the light source 303, the first surface of the transparent substrate faces the cover plate 302, and the second surface of the transparent substrate faces the light source 303.

In some embodiments, the light source 303 is a planar backlight source, which is disposed within the inner side of the cover plate 302. The light source 303 is able to emit incident lights 3031, the incident lights 3031 can pass through the transparent substrate 305, then penetrate through the cover plate 302 and reach the outer side of the cover plate 302 on which reflection of part incident lights 3031 occurs, generating reflected lights 3032, then the reflected lights 3032 will reach the transparent substrate 305 again.

In some embodiments, the first pixel cell array region 305A functions as a proximity sensor. Specifically, incident lights 3031 which are emitted from the backlight source 303 can penetrate through the cover plate 302 and reach an object 311 adjacent to the cover plate 302, reflections of the incident lights 3031 occur on the object 311 for obtaining the reflected lights 3032. Then, the reflected lights 3032 will be collected by the first pixel cell array region 305A once more and converted into photoelectrons or photocurrents. Thereafter, the photoelectrons or the photocurrents can be converted into electrical signals by the first pixel cell array region 305A. As a distance between the object 311 and the first pixel cell array region 305A is in direct proportion to magnitude of the electrical signal, distance between the object 311 and the first pixel cell array region 305A can be obtained through reading the electrical signals by a system chip 323.

The second pixel cell array region 305B functions as a fingerprint sensor, which is implemented through ways almost the same with the first pixel cell array region 305A except that the second pixel cell array region 305B collects a fingerprint of the finger 313 which is contacted with the cover plate 302, and the second pixel cell array region 305B is implemented according to working principles of non-focusing optical fingerprint sensors. Specifically, when the finger 313 is contacted with the cover plate 302, the incident lights 3031 emitted from the light source 303 reach the finger 313 on which reflection occurs, generating the reflected lights 3032, then the reflected lights 3032 can reach the second pixel cell array region 305B again. Image collected by the second pixel cell array region 305B has a size almost the same with that of the fingerprint on the cover plate, and light intensity and spatial distribution of reflected lights 3032 varies according to shapes of the fingerprints, thus valid fingerprint image signals (e.g. fingerprint gray scale image signals) can be achieved. The fingerprint image signals also can be read by the system chip 323.

The third pixel cell array region 305C functions as an ambient light sensor. Specifically, ambient lights, for example the visible lights 315 as shown, penetrate through the cover plate 302 and reach the third pixel cell array region 305C, then the ambient lights will be collected by the third pixel cell array region 305C where photoelectrons or photocurrents will be generated. The photoelectrons or photocurrents can be converted into electrical signals by the third pixel cell array region 305C, and intensity of the ambient lights can be obtained through reading the electrical signals by the system chip 323.

Accordingly, each photodiode in the first pixel cell array region 305A and the second pixel cell array region 305B should have a bottom covered by an opaque layer, so as to prevent lights emitted from the light source 303 from directly irradiating to the photodiodes. Furthermore, both the first pixel cell array region 305A and the second pixel cell array region 305B should have non-opaque regions, so that incident lights 3031 emitted from the light source 303 are able to penetrate through the transparent substrate 305 and reach the cover plate 302. As for the third pixel cell array region 305C, lights emitted from the light source 303 should be prevented from directly irradiating to the photodiodes therein, and the incident lights 3031 are not required to penetrate through the third pixel cell array region 305C, thus the third pixel cell array region 305C may have no non-opaque region.

Accordingly, the first pixel cell array region 305A and the second pixel cell array region 305B have similar implementing modes and are integrated together, thus they can share the light source 303. Further, the third pixel cell array region 305C does not need a light source. Therefore, the integrated optical sensor may have a compact and simple structure, low production cost, and low energy consumption.

It should be noted that, in some other embodiments of the present disclosure, the light source 303 may be disposed on different positions. For example, the light source 303 may be disposed on a border part of the transparent substrate, thus lights emitted from the light source 303 are able to reach the cover plate 302 and be transmitted to the outer side of the cover plate, without penetrating through the transparent substrate 305.

In some embodiments, the first pixel cell array region 305A has an array of first pixel cells 3071, one of the first pixel cells 3071 is illustrated in FIG. 3. The second pixel cell array region 305B has an array of second pixel cells 3072, three of the second pixel cells 3072 are illustrated in FIG. 3. The third pixel cell array region 305C has an array of third pixel cells 3073, one of the third pixel cells 3073 is illustrated in FIG. 3.

In some embodiments, all of the first pixel cells 3071, the second pixel cells 3072, and the third pixel cells 3073 may be CMOS (Complementary Metal-Oxide-Semiconductor) image sensor pixel cells, and each of the first pixel cells 3071, the second pixel cells 3072, and the third pixel cells 3073 includes one or more MOSFETs (Metal-Oxide-Semiconductor Field Effect Transistor).

In some embodiments, all thin film transistors used are amorphous silicon thin film transistors. In another word, all pixel cells formed in the first pixel cell array region 305A, the second pixel cell array region 305B and the third pixel cell array region 305C are amorphous silicon pixel cells. When amorphous silicon pixel cells are used, the lights have to penetrate through the amorphous silicon layers, thus the light source 303 can be a backlight source. Furthermore, production cost will be reduced as well when amorphous silicon pixel cells are used.

In some embodiments, the first pixel cell array region 305A further comprises a first barrier layer 3091 which is located on the transparent substrate. The second pixel cell array region 305B further comprises a second barrier layer 3092 which is located on the transparent substrate. The third pixel cell array region 305C further comprises a third barrier layer 3093 which is located on the transparent substrate as well.

In some embodiments, the first barrier layer 3091, the second barrier layer 3092 and the third barrier layer 3093 may be Black Matrixes (BM) made of printing ink, which are formed by way of screen printing. In some other embodiments, the first barrier layer 3091, the second barrier layer 3092 and the third barrier layer 3093 may be made of metal. For example, all these barrier layers are molybdenum layers formed on the first surface of the transparent substrate 305 by way of evaporation. It should be noted that, the first barrier layer 3091, the second barrier layer 3092 and the third barrier layer 3093 may be made of any other suitable materials or formed on the second surface of the substrate 305.

As the first barrier layer 3091, the second barrier layer 3092 and the third barrier layer 3093 are disposed, lights emitted from the light source 303 are unable to directly irradiate to the corresponding photodiodes in the first pixel cells 3071, the second pixel cells 3072 and the third pixel cells 3073. Accordingly, the third barrier layer 3093 can be disposed on a bottom side of the entire third pixel cell 3073 corresponding thereto. However, the first barrier layer 3091 and the second barrier layer 3092 should be disposed on a fraction of a bottom side of the corresponding first pixel cell 3071 and second pixel cell 3073, so that lights emitted from the light source 303 are able to penetrate through the first pixel cell array region 305A and the second pixel cell array region 305B. Detailed illustrations will be given in the following descriptions referring to FIG. 5 and FIG. 6.

Figure 4:
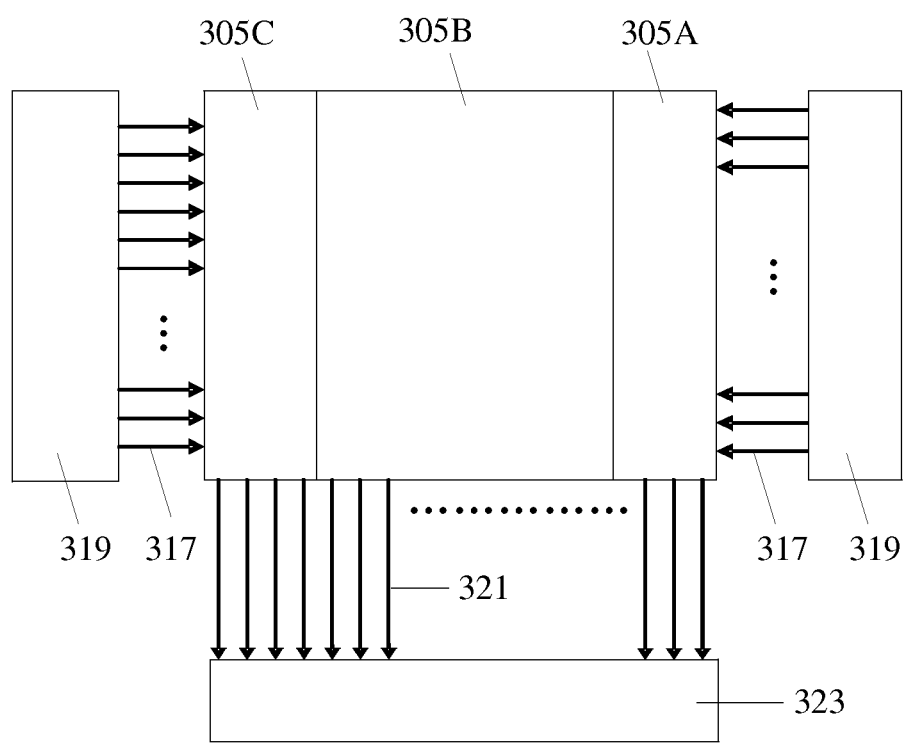
FIG. 4 schematically illustrates a transparent substrate of the integrated optical sensor shown in FIG. 3.

Referring to FIG. 4, the transparent substrate 305 of the integrated optical sensor according to one embodiment of the present disclosure is illustrated.

In the substrate 305, the second pixel cell array region 305B is located between the first pixel cell array region 305A and the third pixel cell array region 305C. As these pixel cell array regions are fabricated on the transparent substrate together in adjacent manner, light information of one pixel cell array region can be shared and applied by other pixel cell array regions, thus some complicated applications or algorithms regarding environmental light can be applied.

In some embodiments, the second pixel cell array region 305B has an area larger than that of the first pixel cell array region 305A and an area of the third pixel cell array region 305C, wherein the area of the first pixel cell array region 305A and the area of the third pixel cell array region 305C are almost equal. It should be noted that, in some other embodiments, the first pixel cell array region 305A, the second pixel cell array region 305B, and the third pixel cell array region 305C may have equal or different areas. Besides, positions and shapes of these pixel cell array regions may be varied if necessary.

In some embodiments, a plurality of parallel gate driving lines 317 and a plurality of parallel data scan lines 321 are disposed on peripheries of the first pixel cell array region 305A, the second pixel cell array region 305B, and the third pixel cell array region 305C, respectively. The gate driving lines 317 electrically connect the first pixel cell array region 305A, the second pixel cell array region 305B, and the third pixel cell array region 305C with a control chip 319, forming a gate driving circuit. The data scan lines 321 electrically couple the first pixel cell array region 305A, the second pixel cell array region 305B, and the third pixel cell array region 305C with a system chip 323, forming a charge data reading chip or a data line reading circuit. When the first pixel cell array region 305A, the second pixel cell array region 305B, and the third pixel cell array region 305C include amorphous silicon thin film transistors, the data line reading circuit can not be disposed on the transparent substrate 305 due to process limit. When the first pixel cell array region 305A, the second pixel cell array region 305B, and the third pixel cell array region 305C include other types of thin film transistor such as monocrystalline silicon thin film transistor, the data line reading circuit can be disposed on the transparent substrate 305.

In some embodiments, both the control chip 319 and the system chip 323 can be integrated on the transparent substrate 305. However, the control chip 319 and the system chip 323 may be coupled to the transparent substrate 305 through flexible connectors, that is, the gate driving circuit is disposed on an external circuit chip.

In some embodiments, both the gate driving lines 317 and the data scan lines 321 can be parallel lines formed by metal such as aluminum, copper, and the like. Furthermore, the gate driving lines 317 and the data scan lines 321 can be formed when forming the pixel cells of the pixel cell array regions.

In some embodiments, electrical signals generated by the first pixel cell array region 305A, the second pixel cell array region 305B, and the first pixel cell array region 305C are read by one single system chip 323. Operation time sequence of the pixel cell array regions are controlled by one single control chip 319, so that each of the pixel cell array regions can work orderly and without crosstalk. Therefore, the pixel cell array regions can be implemented in a coordinate manner. Furthermore, as only one single system chip 323 and one single control chip 319 are required, the integrated optical sensor has more simple structure, lower cost, and takes less space when applied to electronic devices.

In some embodiments, the first pixel cell array region 305A, the second pixel cell array region 305B, and the first pixel cell array region 305C are integrated together. Specifically, the operation time sequence of the integrated optical sensor is controlled by periphery lines which include the gate driving lines 317 and the data scan lines 321, so as to coordinate the first pixel cell array region 305A, the second pixel cell array region 305B, and the first pixel cell array region 305C for implementing different operations. Through controlling the operation time sequence, false detection of the integrated optical sensor may be decreased. For example, through coordinating operations of the first pixel cell array region 305A and the second pixel cell array region 305B, reflected lights 3032 which are reflected to the first pixel cell array region 305A can be prevented from submerging in the ambient lights (the visible lights 315 as shown in FIG. 3).

Figure 5:
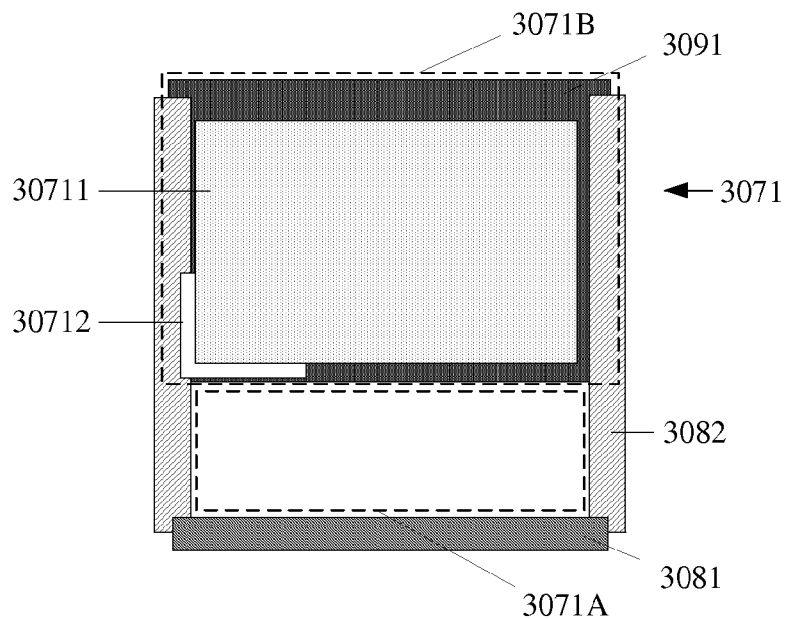
FIG. 5 schematically illustrates a first pixel cell according to an embodiment of the present disclosure.

Referring to FIG. 5, one of the first pixel cells 3071 is illustrated. The first pixel cell 3071 includes a first transparent region 3071A, a first light barrier region 3071B, and a first photodiode 30711 located on an upper side of the first light barrier region 3071B. The light barrier region 3071B includes a first barrier layer 3091 located on the transparent substrate 305, in another word, the first light barrier region 3071B is defined by the first barrier layer 3091. The first photodiode 30711 may include a top electrode (not shown) and a bottom electrode (not shown). The first pixel cell 3071 may further include other structures such as a top crown of a storage capacitor and so on. The first pixel 3071 is coupled to two axial lines, that is, a drive line 3081 and a data line 3082. The drive line 3081 is electrically coupled with the gate driving lines 317 shown in FIG. 4, and the data line 3082 is electrically connected with the data scan lines 321 shown in FIG. 4.

In some embodiments, the first pixel cell 3071 further includes a thin film transistor region 30712 (part of which is shown). The thin film transistor region 30712 may include one or more thin film transistors which are all amorphous silicon thin film transistors. In another word, amorphous silicon thin film transistors are applied to form the pixel cells which further constitute the pixel cell array regions. In the thin film transistor region 30712, the one or more thin film transistors are not only electrically connected with the first photodiode 30711, but also electrically connected with the drive line 3081 and the data line 3082, so that photoelectrons or photo-charges generated by the first photodiode 30711 are able to be controlled and read.

If the thin film transistor region 30712 includes one amorphous silicon thin film transistor, the amorphous silicon thin film transistor may be directly connected with the first photodiode 30711, thus the photoelectrons or the photo-charges generated by the first photodiode 30711 can be transmitted to corresponding data reading circuit through the amorphous silicon thin film transistor.

The thin film transistor region 30712 may include multiple amorphous silicon thin film transistors, such as three amorphous silicon thin film transistors, four amorphous silicon thin film transistors or five amorphous silicon thin film transistors. Specifically, taking four amorphous silicon thin film transistors for example, the four amorphous silicon thin film transistors are a reset transistor, an amplify transistor, a select transistor and a transmit transistor, respectively. In addition to the four amorphous silicon thin film transistors as recited above, the first pixel cell 3071 may further includes a floating diffusion (FD) region which is located between a gate structure of the transmit transistor and a gate structure of the reset transistor. In practice, when no lights being received, the gate of the reset transistor receives a high level pulse signals for resetting the FD region, so that the FD region has a high level; the reset process will be terminated when the gate pulse signals of the reset transistor turn to low level. Then, a gate of the select transistor receives high level pulse signals for reading out an initial signal. The photodiode receives lights during a preset period for generating carriers according to the lights. Then, the gate of the transmit transistor receives high level pulse signals for transmitting the carriers from the photodiode to the FD region where the carriers are converted into voltage signals. Thereafter, the select transistor receives high level pulse signals for outputting the voltage signals from the FD region through the amplify transistor and the select transistor. Accordingly, collection and transmission of optical signals (image signals) will be achieved through collecting signals for two times and (subtraction) calculating of the two collecting results.

It should be noted that, similar to the first pixel cell array region 305A, in some embodiments, the second pixel cell array region 305B includes an array of second pixel cells 3072. Each second pixel cell 3072 includes a second transparent region, a second light barrier region, and a second photodiode. The second light barrier region includes a second barrier layer 3092 located on the transparent substrate 305, wherein the second photodiode is located on an upper side of the second barrier layer 3092. The third pixel cell array region 305C includes an array of third pixel cells 3073. Each third pixel cell 3072 includes a third light barrier region and a third photodiode. The third light barrier region includes a third barrier layer 3093 located on the transparent substrate 305, wherein the third photodiode is located on an upper side of the third barrier layer 3093. Furthermore, the second pixel cells 3072 and the third pixel cells 3073 may have similar structures with the first pixel cells 3071. In another word, both the second pixel cells 3072 and the third pixel cells 3073 include multiple amorphous silicon thin film transistors. However, structures and sizes of the second pixel cells 3072 and the third pixel cells 3073 may vary if necessary. Besides, structures and sizes of the first photodiode 30711 and the second photodiodes, and size of the first transparent region 3071A and the second transparent region may be adjusted according to different requirements.

Figure 6:
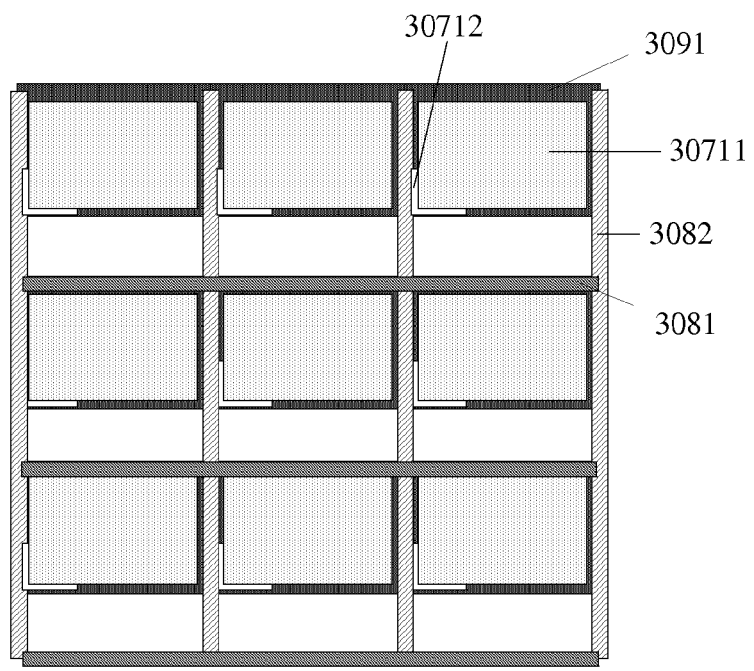
FIG. 6 schematically illustrates a pixel cell array formed by the first pixel cells.
Figure 7:
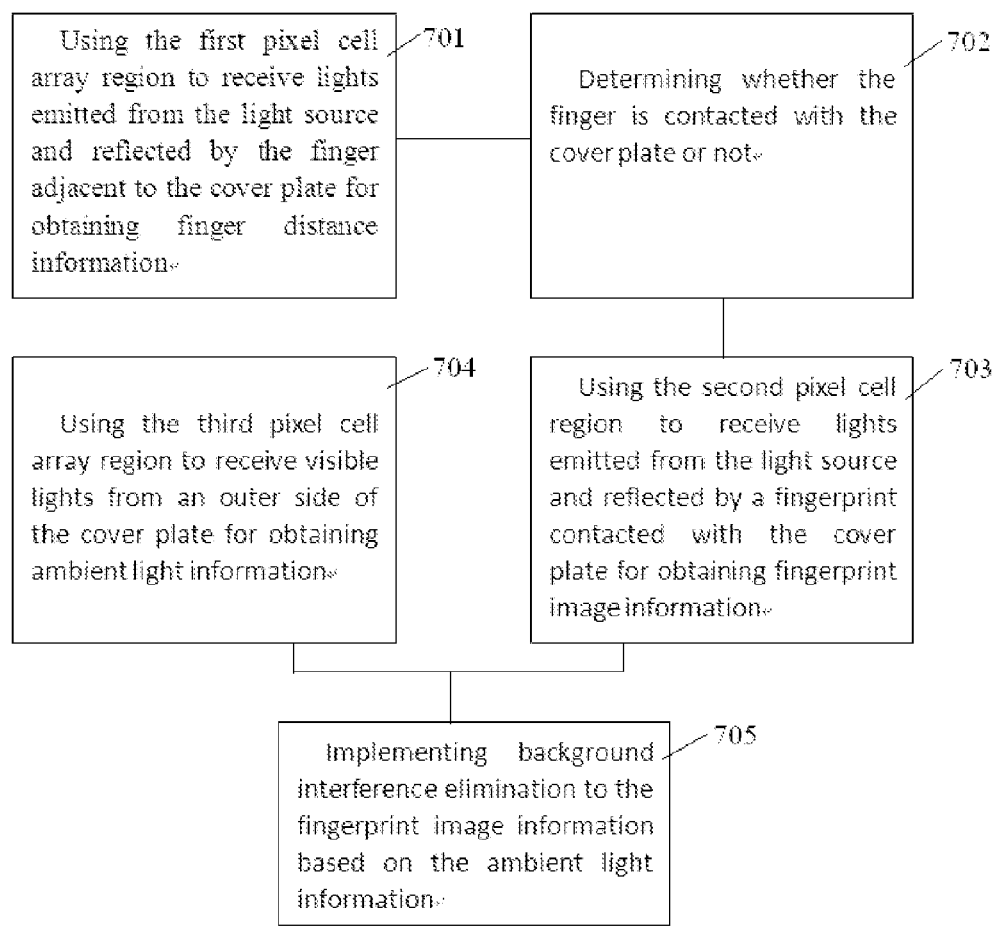
FIG. 7 schematically illustrates a method for using the integrated optical sensor according to an embodiment of the present disclosure.

Referring to FIG. 6, a pixel cell array which is formed by an array of the first pixel cells 3071 is illustrated. As shown, the first pixel cells 3071 are arranged in order, so that an area of the first surface of the transparent substrate 305 can be effectively reduced. It should be noted that, in some other embodiments of the present disclosure, the first pixel cells 3071 may be configured into other arrangement modes.

As the integrated optical sensor provided by embodiments of the present disclosure, includes the first pixel cell array region 305A, the second pixel cell array region 305B and the third pixel cell array region 305C, wherein the first pixel cell array region 305A is adapted to receiving the lights being reflected by the external object adjacent to the cover plate 302; the second pixel cell array region 305B is adapted to receiving the lights being reflected by the fingerprint which is contacted with the cover plate 302; and the third pixel cell array region 305C is adapted to receiving the visible lights from outside. Therefore, the integrated optical sensor provided by embodiments of the present disclosure functions as a proximity sensor, an ambient light sensor and a fingerprint sensor at the same time. Furthermore, the integrated optical sensor only requires one single unified power source, communication interface, chip, light source, and the like, thus the integrated optical sensor may have simple and compact structure, and low cost. Furthermore, the integrated optical sensor may have a convenient structural arrangement, thus less space is required to dispose. Therefore, mini, thin and light electronic devices may be easily achieved when the integrated optical sensors are applied therein.

In the integrated optical sensor provided by the present disclosure, three functions as recited above are orderly and coordinately implemented through one same system controller, almost without any mutual interference. Furthermore, information collected by each pixel cell array region is correlated and can be shared with each other. Accordingly, more operations and works can be implemented, thus the integrated optical sensor may have more application value.

Accordingly, a method for using the above recited integrated optical sensor is also provided by the present disclosure, including step 701 to step 705.

Specifically, step 701: using the first pixel cell array region to receive lights emitted from the light source and reflected by the finger adjacent to the cover plate for obtaining finger distance information.

In some embodiments, the first pixel cell array region functions as a proximity sensor. Therefore, the first pixel cell array region is used firstly for receiving lights emitted from the light source and reflected by the finger adjacent to the cover plate, so as to obtain the finger distance information.

Step 702: determining whether the finger is contacted with the cover plate or not.

In some embodiments, implement of fingerprint collection is based on whether the finger is contacted with the cover plate or not. Specifically, when the finger distance information which represents a distance between the finger and the sensor shows that the finger is contacted with the cover plate, then process of collecting the fingerprint information will be implemented.

Step 703: using the second pixel cell region to receive lights emitted from the light source and reflected by a fingerprint contacted with the cover plate for obtaining fingerprint image information.

In some embodiments, the second pixel cell array region functions as a fingerprint sensor, as recited above in details.

Step 704: using the third pixel cell array region to receive visible lights from an outer side of the cover plate for obtaining ambient light information.

In some embodiments, the third pixel cell array region functions as an ambient light sensor, as recited above in details.

Step 705: implementing background interference elimination to the fingerprint image information based on the ambient light information.

Conventionally, fingerprint sensor and ambient light sensor are implemented independently, thus there is no cooperative operation between each other. However, in the integrated optical sensor which has the third pixel cell array region and the second pixel cell array region integrated on one same transparent substrate, the third pixel cell array region is able to be used to obtain intensity of ambient lights in the surroundings. Then the intensity of the ambient lights may be used to adjust light collection of the second pixel cell array region in advance. Or, the ambient lights obtained by the third pixel cell array region may be used to implement the background interference elimination, after the second pixel cell array region obtains the image. Conventional optical fingerprint sensors corresponded to the second pixel cell array region, have certain sensitivity to interference of the ambient lights, thus the accuracy of the conventional optical fingerprint sensor may be decreased. However, in embodiments of the present disclosure, the third pixel cell array region and the second pixel cell array region are integrated together and are able to share information, so that the integrated optical sensor has better efficiency and accuracy of fingerprint identification.

It should be noted that, in some embodiments of the present disclosure, step 701 and step 702 may be omitted. In some other embodiments, step 704 and step 705 may be omitted.

In some embodiments, all steps from step 701 to step 705 are included. In this condition, the first pixel cell array region, the second pixel cell array region and the third pixel cell array region are sufficiently invoked to operate coordinately, thus new and effective application will be achieved. Furthermore, in the integrated optical sensor of the present disclosure, any other ways may be used to ensure the first pixel cell array region, the second pixel cell array region and the third pixel cell array region operate coordinately. Therefore, false detection rate of the integrated optical sensor may be reduced. For example, as recited above, through coordinating operations between the first pixel cell array region and the third pixel cell array region, lights reflected to the first pixel call array region are able to be prevented from being submerged in the ambient lights.

A method for manufacturing the integrated optical sensor is also provided by embodiments of the present disclosure, including step S1 to step S5.

Step S1: providing a cover plate, a transparent substrate and a light source, wherein the transparent substrate has a first surface and a second surface opposite to the first surface.

In some embodiments, the light source includes at least one selected from infrared light source and visible light source.

In some embodiments, the cover plate is transparent. Specifically, the cover plate may be made of glass, plastic or any other suitable materials. The present disclosure gives no limitation to the material of the cover plate. Furthermore, in some other embodiments, the cover plate may be omitted.

In some embodiments, the transparent substrate may be made of glass or plastic.

Step S2: forming the first pixel cell array region, the second pixel cell array region, and the third pixel cell array region on the first surface. Wherein the first pixel cell array region is adapted to receive the lights which are emitted from the light source and reflected by an external object adjacent to the cover plate; the second pixel cell array region is adapted to receive lights which are emitted from the light source and reflected by fingerprints contacted with the cover plate; the third pixel cell array region is adapted to receive visible lights transmitted from a outer side of the cover plate. Further, the second pixel cell array region is formed between the first pixel cell array region and the third pixel cell array region.

Specifically, the process of forming the first pixel cell array region includes: forming an array of first pixel cells on the first surface, and each of the first pixel cell includes a first transparent region, a first light barrier region and a first photodiode located on the first light barrier region.

Similarly, the process of forming the second pixel cell array region includes: forming an array of second pixel cells on the first surface, and each of the second pixel cells includes a second transparent region, a second light barrier region and a second photodiode located on the second light barrier region.

The process of forming the third pixel cell array region includes: forming an array of third pixel cells on the first surface, and each of the pixel cells includes a third light barrier region and a third photodiode located on the third light barrier region.

In some embodiments, the first light barrier region is formed through forming a first barrier layer on the transparent substrate, the second light barrier region is formed through forming a second barrier layer on the transparent substrate, and the third light barrier region is formed through forming a third barrier layer on the transparent substrate.

In some embodiments, the first pixel cells, the second pixel cells and the third pixel cells include multiple thin film transistors which are formed through ways of forming the amorphous silicon thin film transistors.

In some embodiments, the gate driving circuit is formed when forming the first pixel cells, the second pixel cells and the third pixel cells. The gate driving circuit is formed for coupling the first pixel cells, the second pixel cells and the third pixel cells to the control chip, respectively.

In some embodiments, the data reading circuit is formed when forming the first pixel cells, the second pixel cells and the third pixel cells. The data reading circuit is formed for coupling the charge-signals or voltage signals of the first pixel cells, the second pixel cells and the third pixel cells with the charge-signals or voltage signals with the system chip, respectively.

In some embodiments, both the control chip and the system chip are integrated on the transparent substrate. However, the control chip and the system chip may be coupled with the transparent substrate through flexible connectors, that is, the gate driving circuit is disposed on the external circuit chip.

Step S3: forming a encapsulation substrate on the first pixel cell array region, the second pixel cell array region, and the third pixel cell array region, wherein the encapsulation substrate covers the first pixel cell array region, the second pixel cell array region, and the third pixel cell array region.

Step S4: disposing the cover plate on a position above the transparent substrate and facing the first surface of the transparent substrate.

In some embodiments, both the cover plate and the transparent substrate are disposed in the electronic device, wherein the cover plate is sealed to a housing of the electronic device, the transparent substrate is placed inside the electronic device.

Step S5: disposing the light source on an inner side of the cover plate, wherein lights emitted from the light source are able to penetrate through the cover plate and reach an outer side of the cover plate.

In some embodiments, the transparent substrate is disposed between the cover plate and the light source, wherein the first surface faces the cover plate, and the second surface faces the light source.

In should be noted that, in some other embodiments of the present disclosure, the cover plate and the light source may be disposed in other suitable orders.

In the method for manufacturing the integrated optical sensor provided by the present disclosure, as the first pixel cell array region, the second pixel cell array region and the third pixel cell array region are integrated together, the manufacturing process may have less steps and a convenient encapsulation process. Furthermore, the first pixel cell array region, the second pixel cell array region and the third pixel cell array region are formed on different regions without mutual effects, thus the manufacturing process may have less difficulties, high yield, less time and lower cost.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. An integrated optical sensor, comprising:
 a light source;
 a transparent substrate, having a first surface and a second surface opposite to each other;
 a first pixel cell array region, located on the first surface and adapted to receiving lights emitted from the light source and reflected by an external object;
 a second pixel cell array region, located on the first surface and adapted to receiving lights emitted from the light source and reflected by a fingerprint;
 a third pixel cell array region, located on the first surface and adapted to receiving visible lights from outside to obtain ambient light information; and
 a processor to determine whether to adjust an intensity of light emitted by the light source according to the ambient light information obtained in the third pixel cell array region.

2. The integrated optical sensor according to claim 1, further comprising: an encapsulation substrate which is located on and covering the first pixel cell array region, the second pixel cell array region and third pixel cell array region.

3. The integrated optical sensor according to claim 2, further comprising: a cover plate above the transparent substrate and facing the first surface.

4. The integrated optical sensor according to claim 3, wherein the light source is below the transparent substrate and facing the second surface.

5. The integrated optical sensor according to claim 4, wherein the first pixel cell array region comprises an array of first pixel cells, wherein each first pixel cell comprises a first transparent region, a first light barrier region and a first photodiode, and the first photodiode is located above the first light barrier region;
 the second pixel cell array region comprises an array of second pixel cells, wherein each second pixel cell comprises a second transparent region, a second light barrier region and a second photodiode, and the second photodiode is located above the second light barrier region; and
 the third pixel cell array region comprises an array of third pixel cells, wherein each third pixel cell comprises a third light barrier region and a third photodiode, and the third photodiode is located above the third light barrier region.

6. The integrated optical sensor according to claim 5, wherein the first light barrier region has a first barrier layer located on the transparent substrate,
 the second light barrier region has a second barrier layer located on the transparent substrate, and
 the third light barrier region has a third barrier layer located on the transparent substrate.

7. The integrated optical sensor according to claim 5, wherein each of the first pixel cells, the second pixel cells and the third pixel cells comprises one or more thin film transistors which are amorphous silicon thin film transistors.

8. The integrated optical sensor according to claim 5, wherein the second pixel cells are coupled to a control chip through a gate driving circuit.

9. The integrated optical sensor according to claim 8, wherein the gate driving circuit is located on the transparent substrate or an external circuit chip.

10. The integrated optical sensor according to claim 5, wherein the first pixel cells, the second pixel cells and the third pixel cells are coupled to a system chip through a data reading circuit.

11. The integrated optical sensor according to claim 1, wherein the light source comprises at least one selected from an infrared light source and a visible light source.

12. The integrated optical sensor according to claim 1, wherein the second pixel cell array region is disposed between the first pixel cell array region and the third pixel cell array region.

13. A method for using the integrated optical sensor according to claim 1, comprising:
 using the third pixel cell array region to receive visible lights from outside, so as to obtain ambient light information; and determining, with a processor, whether to adjust an intensity of light emitted by the light source according to the ambient light information obtained in the third pixel cell array region.

14. The method according to claim 13, further comprising:
using the first pixel cell array region to receive lights emitted from the light source and reflected by a finger, so as to obtain distance information of the finger; and
determining whether to use the second pixel cell array region to obtain fingerprint image information, according to the distance information of the finger obtained in the first pixel cell array region.

15. The method according to claim 14, further comprising determining to use the second pixel cell array region to obtain the fingerprint image information, when the distance information of the finger indicates that the finger is contacted with a cover plate of the integrated optical sensor.

16. The method according to claim 13, further comprising determining whether to implement a background interference elimination to a fingerprint image information obtained in the second pixel cell array region, according to the ambient light information obtained by the third pixel cell array region.

17. The integrated optical sensor according to claim 1, wherein the processor further determines whether to implement a background interference elimination to a fingerprint image information obtained in the second pixel cell array region, according to the ambient light information obtained in the third pixel cell array region.

18. The integrated optical sensor according to claim 1, wherein the processor further determines whether to use the second pixel cell array region to obtain fingerprint image information, according to distance information of a finger obtained in the first pixel cell array region.

19. The integrated optical sensor according to claim 18, wherein the processor further determines to use the second pixel cell array region to obtain the fingerprint image information, when the distance information of the finger indicates that the finger is contacted with a cover plate of the integrated optical sensor.

20. A method for manufacturing an integrated optical sensor, comprising:
providing a transparent substrate and a light source, wherein the transparent substrate has a first surface and a second surface opposite to each other;
forming a first pixel cell array region on the first surface, for receiving lights emitted from the light source and reflected by an external object;
forming a second pixel cell array region on the first surface, for receiving lights emitted from the light source and reflected by a fingerprint;
forming a third pixel cell array region on the first surface, for receiving visible lights from outside, to obtain ambient light information; and
providing a processor to determine whether to adjust an intensity of lights emitted by the light source according to the ambient light information obtained by the third pixel cell array region.

21. The method according to claim 20, further comprising:
forming an encapsulation substrate on the first pixel cell array region, the second pixel cell array region and third pixel cell array region, for covering the first pixel cell array region, the second pixel cell array region and third pixel cell array region.

22. The method according to claim 21, further comprising:
providing a cover plate; and
after the first pixel cell array region, the second pixel cell array region and the third pixel cell array region are formed, disposing the cover plate at a position above the transparent substrate and facing the first surface.

23. The method according to claim 22, further comprising:
after the first pixel cell array region, the second pixel cell array region and the third pixel cell array region are formed, disposing the light source at a position below the transparent substrate and facing the second surface.

24. The method according to claim 23, wherein forming the first pixel cell array region, the second pixel cell array region and the third pixel cell array region on the first surface further respectively comprising:
forming an array of first pixel cells on the first surface, each of the first pixel cell comprises a first transparent region, a first light barrier region and a first photodiode located on the first light barrier region;
forming an array of second pixel cells on the first surface, each of the second pixel cells comprises a second transparent region, a second light barrier region and a second photodiode located on the second light barrier region; and
forming an array of third pixel cells on the first surface, and each of the pixel cells comprises a third light barrier region and a third photodiode located on the third light barrier region.

25. The method according to claim 24, wherein the first light barrier region is formed by forming a first barrier layer on the transparent substrate, the second light barrier region is formed by forming a second barrier layer on the transparent substrate, and the third light barrier region is formed by forming a third barrier layer on the transparent substrate.

26. The method according to claim 23, wherein each of the first pixel cells, the second pixel cells and the third pixel cells comprises one or more thin film transistors which are amorphous silicon thin film transistors.

27. The method according to claim 23, further comprising: forming a gate driving circuit when forming the second pixel cells for coupling the second pixel cells to a control chip.

28. The method according to claim 27, wherein the gate driving circuit is formed on the transparent substrate or on an external circuit chip.

29. The method according to claim 23, further comprising: forming a data reading circuit when forming the first pixel cells, the second pixel cells and the third pixel cells for coupling charge signals or voltage signals of the first pixel cells, the second pixel cells and the third pixel cells to a system chip.

30. The method according to claim 20, wherein the light source comprises at least one selected from an infrared light source and a visible light source.

31. The method according to claim 20, wherein the second pixel cell array region is formed between the first pixel cell array region and the third pixel cell array region.

32. The method for manufacturing an integrated optical sensor according to claim 20, wherein the processor further determines whether to implement a background interference elimination to a fingerprint image information obtained by the second pixel cell array region, according to the ambient light information obtained by the third pixel cell array region.

33. The method for manufacturing an integrated optical sensor according to claim 20, wherein the processor further determines whether to use the second pixel cell array region to obtain fingerprint image information, according to distance information of a finger obtained in the first pixel cell array region.

34. The method for manufacturing an integrated optical sensor according to claim 20, wherein the processor further determines to use the second pixel cell array region to obtain the fingerprint image information, when the distance information of the finger indicates that the finger is contacted with a cover plate of the integrated optical sensor.

* * * * *